(12) United States Patent
Ikemoto

(10) Patent No.: US 12,438,247 B2
(45) Date of Patent: Oct. 7, 2025

(54) TRANSMISSION LINE AND ELECTRONIC DEVICE

(71) Applicant: Murata Manufacturing Co., Ltd., Nagaokakyo (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 255 days.

(21) Appl. No.: 18/197,273

(22) Filed: May 15, 2023

(65) Prior Publication Data

US 2023/0282955 A1    Sep. 7, 2023

Related U.S. Application Data

(63) Continuation of application No. PCT/JP2021/042514, filed on Nov. 19, 2021.

(30) Foreign Application Priority Data

Nov. 30, 2020    (JP) ................................ 2020-198386

(51) Int. Cl.
  *H01P 3/08*    (2006.01)
  *H05K 1/14*    (2006.01)

(52) U.S. Cl.
  CPC . *H01P 3/08* (2013.01); *H05K 1/14* (2013.01)

(58) Field of Classification Search
  CPC .................................. H01P 3/08; H05K 1/14
  USPC ...................................................... 333/238
  See application file for complete search history.

(56) References Cited

U.S. PATENT DOCUMENTS

2018/0309182 A1    10/2018    Iida et al.

FOREIGN PATENT DOCUMENTS

| JP | 62269401 A | 11/1987 |
| JP | 2008227052 A | 9/2008 |
| JP | 7180788 B2 * | 11/2022 | ................ H01P 3/08 |
| WO | 0180347 A1 | 10/2001 |
| WO | 2009128598 A1 | 10/2009 |
| WO | 2014163728 A2 | 10/2014 |

(Continued)

OTHER PUBLICATIONS

JP7180788 English Translation (Year: 2022).*

(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

A transmission line includes a laminated body, a first signal conductor layer in the laminated body and extending in a longitudinal direction, and a first ground conductor layer in the laminated body and provided above the first signal conductor layer to overlap the first signal conductor layer in a vertical direction. A first hollow portion is located above the first signal conductor layer and below or adjacent to the first ground conductor layer. The first hollow portion overlaps the first signal conductor layer and the first ground conductor layer in the vertical direction. An insulator layer in the laminated body is above the first hollow portion. A first upper cavity is provided in the first ground conductor layer. At least a portion of the first upper cavity overlaps the first hollow portion and the first signal conductor layer in the vertical direction.

20 Claims, 14 Drawing Sheets

(56) References Cited

FOREIGN PATENT DOCUMENTS

WO 2017130731 A1 8/2017

OTHER PUBLICATIONS

International Search Report in PCT/JP2021/042514, mailed Feb. 1, 2022, 3 pages.
Written Opinion in PCT/JP2021/042514, mailed Feb. 1, 2022, 3 pages.

* cited by examiner

TRANSMISSION LINE AND ELECTRONIC DEVICE

CROSS REFERENCE TO RELATED APPLICATIONS

This application claims the benefit of priority to Japanese Patent Application No. 2020-198386 filed on Nov. 30, 2020 and is a Continuation application of PCT Application No. PCT/JP2021/042514 filed on Nov. 19, 2021. The entire contents of each application are hereby incorporated herein by reference.

BACKGROUND OF THE INVENTION

1. Field of the Invention

The present invention relates to a transmission line through which a high-frequency signal is transmitted and to an electronic device.

2. Description of the Related Art

For example, a flexible printed wiring board described in Japanese Unexamined Patent Application Publication No. 2008-227052 is a known conventional invention regarding a transmission line. This flexible printed wiring board includes a plurality of insulating sheets, a signal line, and a shield material. The plurality of insulating sheets are laminated together in the vertical direction to form a laminated body. The signal line and the shield material are provided in the laminated body. A void is provided between the signal line and the shield material. Accordingly, the signal line and the shield material face each other across the void. In addition, the shield material has a plurality of slits. The plurality of slits overlap the signal line and the void in the vertical direction. In the flexible printed wiring board described in Japanese Unexamined Patent Application Publication No. 2008-227052, since the shield material has the plurality of slits, the flexibility of the flexible printed wiring board can be improved.

In the flexible printed wiring board described in Japanese Unexamined Patent Application Publication No. 2008-227052, it is difficult to obtain flexibility of the flexible printed wiring board while suppressing deformation of the void. More specifically, the shield material is not supported by the insulating sheets above the void. Furthermore, the shield material has the plurality of slits. Accordingly, since the shield material is likely to be deformed in the flexible printed wiring board, the void may be deformed. In this case, the characteristic impedance of the flexible printed wiring board changes.

The strength of the shield material is to be increased to suppress deformation of the void. Accordingly, the thickness of the shield material only needs to be increased. However, the shield material has a high elastic modulus. Accordingly, when the thickness of the shield material increases, the flexibility of the flexible printed wiring board is likely to decrease.

SUMMARY OF THE INVENTION

Accordingly, preferred embodiments of the present invention provide transmission lines and electronic devices that are each able to obtain flexibility of the transmission line while reducing or preventing deformation of the hollow portion.

A transmission line according to a preferred embodiment of the present invention includes a laminated body including a plurality of insulator layers laminated together in a vertical direction, a first signal conductor layer provided in the laminated body, the first signal conductor layer extending in a longitudinal direction orthogonal or substantially orthogonal to the vertical direction, and a first ground conductor layer provided in the laminated body, the first ground conductor layer being provided above the first signal conductor layer to overlap the first signal conductor layer in the vertical direction, in which a first hollow portion is provided in the laminated body so as to be located above the first signal conductor layer and below or adjacent to the first ground conductor layer, the first hollow portion overlaps the first signal conductor layer and the first ground conductor layer in the vertical direction, the plurality of insulator layers include a first insulator layer provided above the first hollow portion, a first upper cavity is provided in the first ground conductor layer, and at least a portion of the first upper cavity overlaps the first hollow portion and the first signal conductor layer in the vertical direction.

In the transmission lines and the electronic devices according to preferred embodiments of the present invention, the flexibility of the transmission line is able to be obtained while the deformation of the hollow portion is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment
Structure of Transmission Line

Figure 1:
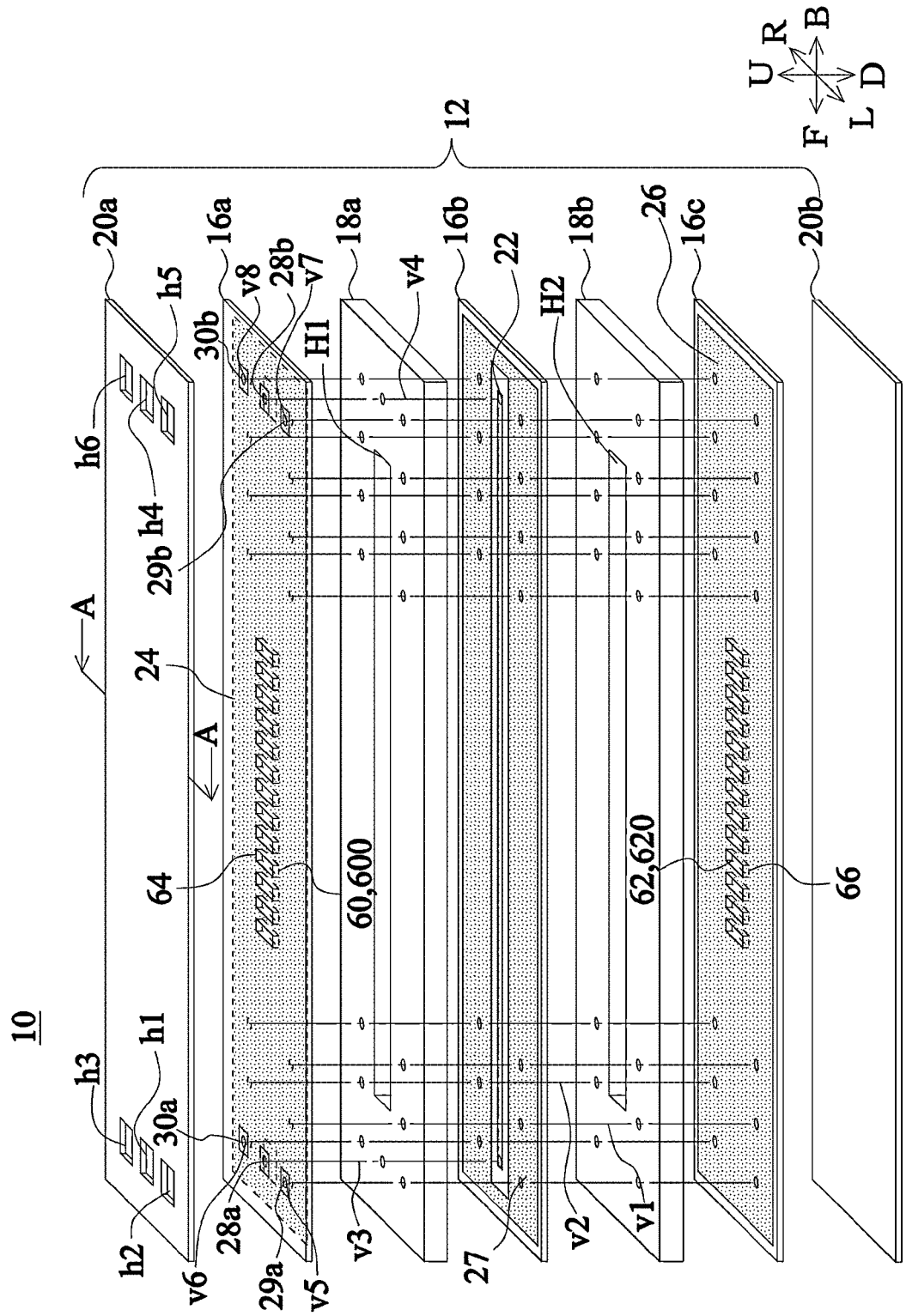
FIG. 1 is an exploded perspective view of a transmission line 10 according to a preferred embodiment of the present invention.
Figure 2:
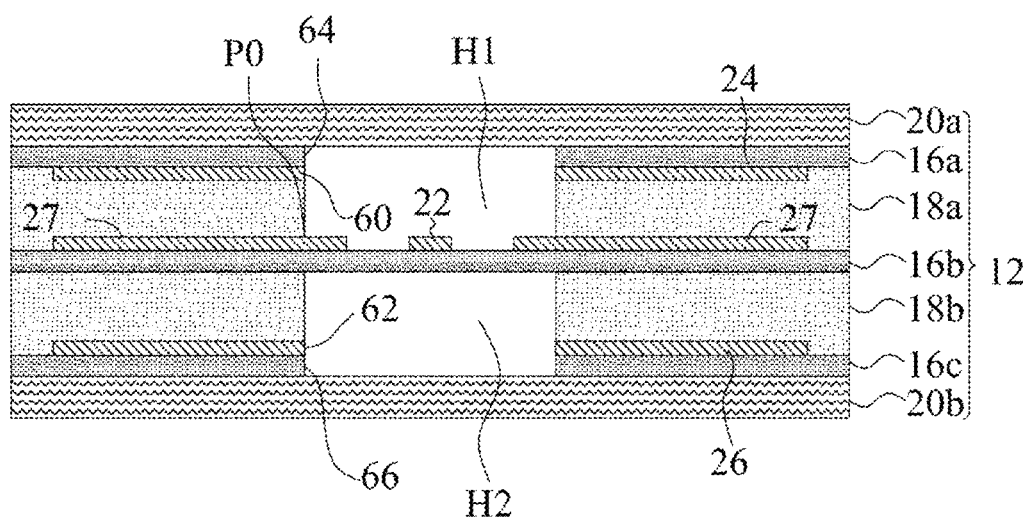
FIG. 2 is a sectional view of the transmission line 10 taken along line A-A in FIG. 1.
Figure 2:
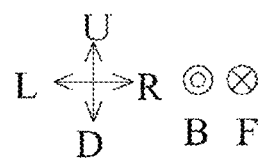

The structure of a transmission line 10 according to a preferred embodiment of the present invention will be described below with reference to the drawings. FIG. 1 is an exploded perspective view of the transmission line 10. In FIG. 1, only typical interlayer connection conductors v1 and v2 of a plurality of interlayer connection conductors v1 and v2 are denoted by reference numerals. FIG. 2 is a sectional view of the transmission line 10 taken along line A-A in FIG. 1.

In this specification, directions are defined as described below. The lamination direction of a laminated body 12 of the transmission line 10 is defined as a vertical direction. In addition, the direction in which the first signal conductor layer 22 of the transmission line 10 extends is defined as a longitudinal direction. In addition, the direction of the line width of the first signal conductor layer 22 is defined as a left-right direction. The vertical direction, the longitudinal direction, and the left-right direction are orthogonal or substantially orthogonal to each other.

In the following, X represents a component or a member of the transmission line 10. Unless otherwise specified, portions of X are defined as described below in this specification. The front portion of X represents the front half of X. The rear portion of X represents the rear half of X. The left portion of X represents the left half of X. The right portion of X represents the right half of X. The upper portion of X represents the upper half of X. The lower portion of X represents the lower half of X. The front end of X represents the end in the forward direction of X. The rear end of X represents the end in the backward direction of X. The left end of X represents the end in the left direction of X. The right end of X represents the end in the right direction of X. The upper end of X represents the end in the upward direction of X. The lower end of X represents the end in the downward direction of X. The front-end portion of X represents the front end of X and the vicinity thereof. The rear-end portion of X represents the rear end of X and the vicinity thereof. The left end portion of X represents the left end of X and the vicinity thereof. The right end portion of X represents the right end of X and the vicinity thereof. The upper end portion of X represents the upper end of X and the vicinity thereof. The lower end portion of X represents the lower end of X and the vicinity thereof.

First, the structure of the transmission line 10 will be described with reference to FIG. 1. The transmission line 10 is a line through which a high-frequency signal is transmitted. The transmission line 10 is used to electrically connect two circuits in an electronic device such as a smartphone, for example. As illustrated in FIG. 1, the transmission line 10 includes the laminated body 12, the first signal conductor layer 22, a first ground conductor layer 24, a second ground conductor layer 26, a ground conductor layer 27, signal terminals 28a and 28b, ground terminals 29a, 29b, 30a, and 30b, the plurality of interlayer connection conductors v1 and v2, and interlayer connection conductors v3 to v8.

The laminated body 12 has a plate shape. Accordingly, the laminated body 12 includes an upper main surface and a lower main surface. The upper main surface and the lower main surface of the laminated body 12 have a rectangular or substantially rectangular shape with long sides extending in the longitudinal direction. Accordingly, the length in the longitudinal direction of the laminated body 12 is greater than the length in the left-right direction of the laminated body 12.

As illustrated in FIG. 1, the laminated body 12 includes insulator layers 16a to 16c, 18a, 18b, 20a, and 20b. The laminated body 12 has a structure including the insulator layers 20a, 16a, 18a, 16b, 18b, 16c, and 20b laminated together in this order from top to bottom in the vertical direction. The insulator layers 20a, 16a to 16c, 18a, 18b, and 20b have the same rectangular or substantially the same rectangular shape in the vertical direction as the laminated body 12. The insulator layers 16a to 16c are flexible dielectric sheets. The material of the insulator layers 16a to 16c is, for example, a thermoplastic resin. The thermoplastic resin is, for example, a liquid crystal polymer or a PTFE (polytetrafluoroethylene). The material of the insulator layers 16a to 16c may be, for example, a polyimide. Each of the insulator layers 18a and 18b includes a resin layer and an adhesive layer. The material of the resin layer is, for example, an epoxy resin, a fluorine-based resin, or an acrylic resin. The adhesive layer is applied to the lower main surface of the resin layer of the insulator layer 18a and the upper main surface of the insulator layer 18b. As described above, the material of the insulator layers 18a and 18b differs from the material of the insulator layers 16a to 16c. In addition, the elastic modulus of the material of each of the insulator layers 16a to 16c, 18a, and 18b is smaller than the elastic modulus of the material of the first ground conductor layer 24 and the elastic modulus of the material of the second ground conductor layer 26, which will be described later. The insulator layer 20 is, for example, a sheet of liquid crystal polymer or polyimide onto which an adhesive has been applied.

However, the insulator layers 18a and 18b may define and function as adhesive layers. In this case, the insulator layer 18a defines and functions as an adhesive layer that joins the insulator layer 16a on the insulator layer 18a and the insulator layer 16b below the insulator layer 18a to each other. The insulator layer 18b defines and functions as an adhesive layer that joins the insulator layer 16b on the insulator layer 18b and the insulator layer 16c below the insulator layer 18b to each other. Accordingly, the insulator layers 18a and 18b are sheet-shaped adhesives.

As illustrated in FIG. 1, the first signal conductor layer 22 is provided in the laminated body 12. In the present preferred embodiment, the first signal conductor layer 22 is provided on the upper main surface of the insulator layer 16b. Accordingly, the first signal conductor layer 22 is provided in the laminated body 12. The first signal conductor layer 22 has a linear shape, for example. The first signal conductor layer 22 extends in the longitudinal direction. The first signal conductor layer 22 is located in the middle in the left-right direction of the upper main surface of the insulator layer 16b.

As illustrated in FIG. 1, the first ground conductor layer 24 is provided in the laminated body 12. The first ground conductor layer 24 is provided above the first signal conductor layer 22 to overlap the first signal conductor layer 22 in the vertical direction. In this specification, "The first ground conductor layer 24 is provided above the first signal conductor layer 22" indicates the following state. At least a portion of the first ground conductor layer 24 is disposed within a region through which the first signal conductor layer 22 passes when the first signal conductor layer 22 moves in parallel or substantially in parallel in the upward direction. Accordingly, the first ground conductor layer 24 may remain within the region through which the first signal conductor layer 22 passes when the first signal conductor layer 22 moves in parallel or substantially parallel in the upward direction or may project from the region through which the first signal conductor layer 22 passes when the first signal conductor layer 22 moves in parallel or substantially in parallel in the upward direction. Here, in the present preferred embodiment, the first ground conductor layer 24 is provided on the lower main surface of the insulator layer 16a. In addition, the first ground conductor layer 24 covers the entire or substantially the entire surface of the lower main surface of the insulator layer 16a. Accordingly, the first ground conductor layer 24 projects from the region through which the first signal conductor layer 22 passes when the first signal conductor layer 22 moves in parallel or substantially in parallel in the upward direction.

As illustrated in FIG. 1, the second ground conductor layer 26 is provided in the laminated body 12. The second ground conductor layer 26 is provided below the first signal conductor layer 22 to overlap the first signal conductor layer 22 in the vertical direction. In the present preferred embodiment, the second ground conductor layer 26 is provided on the upper main surface of the insulator layer 16c. In addition, the second ground conductor layer 26 covers the entire or substantially the entire surface of the upper main surface of the insulator layer 16c. The first signal conductor layer 22, the first ground conductor layer 24, and the second ground conductor layer 26 as described above have a stripline structure.

The ground conductor layer 27 is provided on the upper main surface of the insulator layer 16b. The ground conductor layer 27 surrounds the first signal conductor layer 22.

The plurality of interlayer connection conductors v1 and v2 electrically connect the first ground conductor layer 24, the second ground conductor layer 26, and the ground conductor layer 27 to each other. More specifically, the plurality of interlayer connection conductors v1 and v2 pass through the insulator layer 16a to 16c, 18a, and 18b in the vertical direction. The upper end portions of the plurality of interlayer connection conductors v1 and v2 are connected to the first ground conductor layer 24. The lower end portions of the plurality of interlayer connection conductors v1 and v2 are connected to the second ground conductor layer 26. The middle portions of the plurality of interlayer connection conductors v1 and v2 are connected to the ground conductor layer 27. The plurality of interlayer connection conductors v1 are provided to the left of the first signal conductor layer 22. The plurality of interlayer connection conductors v1 are arranged in a line at equal intervals in the longitudinal direction. The plurality of interlayer connection conductors v2 are provided to the right of the first signal conductor layer 22. The plurality of interlayer connection conductors v2 are disposed in a line at equal intervals in the longitudinal direction. However, the plurality of interlayer connection conductors v1 and v2 are provided in unbent sections A1 and A3, which will be described later, and are not provided in a bent section A2, which will be described later.

The signal terminal 28a is provided on the upper main surface of the laminated body 12. More specifically, the signal terminal 28a is provided in the front-end portion of the upper main surface of the insulator layer 16a. The signal terminal 28a overlaps the front-end portion of the first signal conductor layer 22 in the vertical direction. The signal terminal 28a has a rectangular or substantially rectangular shape in the vertical direction.

The interlayer connection conductor v3 electrically connects the signal terminal 28a and the first signal conductor layer 22 to each other. Specifically, the interlayer connection conductor v3 passes through the insulator layers 16a and 18a in the vertical direction. The upper end of the interlayer connection conductor v3 is connected to the signal terminal 28a. The lower end of the interlayer connection conductor v3 is connected to the left end portion of the first signal conductor layer 22. Accordingly, the signal terminal 28a is electrically connected to the first signal conductor layer 22. In addition, the first ground conductor layer 24 is not provided around the interlayer connection conductor v3 such that the interlayer connection conductor v3 is insulated from the first ground conductor layer 24. The high-frequency signal is input to and output from the first signal conductor layer 22 via the signal terminal 28a.

The signal terminal 28b and the interlayer connection conductor v4 have structures that are longitudinally symmetric or substantially symmetrical to the structure of the signal terminal 28a and the interlayer connection conductor v3. Accordingly, the signal terminal 28b and the interlayer connection conductor v4 will not be described.

The ground terminal 29a is provided on the upper main surface of the laminated body 12. More specifically, the ground terminal 29a is provided in the front-end portion of the upper main surface of the insulator layer 16a. The ground terminal 29a is provided to the left of the signal terminal 28a. The ground terminal 29a overlaps the first ground conductor layer 24 in the vertical direction. The ground terminal 29a has a rectangular or substantially rectangular shape in the vertical direction.

An interlayer connection conductor v5 electrically connects the ground terminal 29a, the first ground conductor layer 24, the second ground conductor layer 26, and the ground conductor layer 27 to each other. Specifically, the interlayer connection conductor v5 passes through the insulator layers 16a to 16c, 18a, and 18b in the vertical direction. The upper end of the interlayer connection conductor v5 is connected to the ground terminal 29a. The middle portion of the interlayer connection conductor v5 is connected to the first ground conductor layer 24 and the ground conductor layer 27. The lower end of the interlayer connection conductor v5 is connected to the second ground conductor layer 26. The first ground conductor layer 24 is connected to the ground potential via the ground terminal 29a. It should be noted that the ground terminal 30a and the interlayer connection conductor v6 have structures that are bilaterally symmetric or substantially symmetric to the structures of the ground terminal 29a and the interlayer connection conductor v5. Accordingly, the ground terminal 30a and the interlayer connection conductor v6 will not be described.

In addition, the structures of the ground terminals 29b and 30b and the interlayer connection conductors v7 and v8 are longitudinally symmetric to the structures of the ground terminals 29a and 30a and the interlayer connection conductors v5 and v6. Accordingly, the ground terminals 29b and 30b and the interlayer connection conductors v7 and v8 will not be described.

The first signal conductor layer 22, the first ground conductor layer 24, the second ground conductor layer 26, the ground conductor layer 27, the signal terminals 28a and 28b, and the ground terminals 29a, 29b, 30a, and 30b as described above are formed by, for example, etching metal foils provided on the upper main surfaces or the lower main surfaces of the insulator layers 16a to 16c. The metal foils are, for example, copper foils. In addition, the interlayer connection conductors v1 to v8 are, for example, through-hole conductors. The through-hole conductors are created by forming through-holes in the insulator layers 16a to 16c, 18a, and 18b and plating the through-holes. The interlayer connection conductors v1 to v8 may be, for example, via-hole conductors. The via-hole conductors are created by forming through-holes in the insulator layers 16a to 16c, 18a, and 18b, filling the through-holes with a conductive paste, and sintering the conductive paste.

The insulator layers 20a and 20b are flexible insulator layers. The insulator layers 20a and 20b have a rectangular or substantially rectangular shape in the vertical direction, which is the same or similar as the shape of the laminated body 12. The insulator layer 20a as described above is pasted onto the insulator layer 16a before the lamination process. Similarly, the insulator layer 20b is pasted onto the insulator layer 16c before the lamination process.

The insulator layer 20a covers the entire or substantially the entire surface of the upper main surface of the insulator layer 16a. Accordingly, the insulator layer 20a protects the first ground conductor layer 24. However, the insulator layer 20a includes cavities h1 to h6. The cavity h1 overlaps the signal terminal 28a in the vertical direction. Accordingly, the signal terminal 28a is exposed to the outside from the transmission line 10 through the cavity h1. The cavity h2 is provided to the left of the cavity h1. The cavity h2 overlaps the ground terminal 29a in the vertical direction. Accordingly, the ground terminal 29a is exposed to the outside from the transmission line 10 through the cavity h2. The cavity h3 is provided to the right of the cavity h1. The cavity h3 overlaps the ground terminal 30a in the vertical direction. Accordingly, the ground terminal 30a is exposed to the outside from the transmission line 10 through the cavity h3. The structures of the cavities h4 to h6 are longitudinally symmetric or substantially symmetric to the structures of the cavities h1 to h3. Accordingly, the cavities h4 to h6 will not be described.

Next, a first hollow portion H1 and a hollow portion H2 will be described. The first hollow portion H1 is provided in the laminated body 12 so as to be located above the first signal conductor layer 22 and below the first ground conductor layer 24. More specifically, the insulator layer 18a includes the first hollow portion H1 that passes through the insulator layer 18a in the vertical direction, as illustrated in FIG. 2. As illustrated in FIG. 1, the first hollow portion H1 extends in the longitudinal direction as viewed in the vertical direction. The first hollow portion H1 is provided in the middle in the left-right direction of the insulator layer 18a. Accordingly, the first hollow portion H1 overlaps the first signal conductor layer 22 and the first ground conductor layer 24 in the vertical direction. Accordingly, as illustrated in FIG. 2, the first signal conductor layer 22 and the first ground conductor layer 24 face each other across the first hollow portion H1.

The hollow portion H2 is provided in the laminated body 12 so as to be located below the first signal conductor layer 22 and above the second ground conductor layer 26. More specifically, the insulator layer 18b includes the hollow portion H2 passing through the insulator layer 18b in the vertical direction, as illustrated in FIG. 2. As illustrated in FIG. 1, the hollow portion H2 extends in the longitudinal direction as viewed in the vertical direction. The hollow portion H2 is provided in the middle in the left-right direction of the insulator layer 18b. Accordingly, the hollow portion H2 overlaps the first signal conductor layer 22 and the second ground conductor layer 26 in the vertical direction.

Next, first upper cavities 60, lower cavities 62, first insulator layer cavities 64, and second insulator layer cavities 66 will be described. The plurality of first upper cavities 60 are provided in the first ground conductor layer 24. In this specification, cavities are regions in which no conductors or no insulating mat are present in ground conductor layers or insulator layers. The outer edges of the cavities have annular shapes. Accordingly, the cavities are surrounded by conductors or insulating materials. The plurality of first upper cavities 60 have a rectangular or substantially rectangular shape with long sides extending in the left-right direction as viewed in the vertical direction. That is, the plurality of first upper cavities 60 are slits extending in the left-right direction. The plurality of first upper cavities 60 are provided in the middle in the left-right direction of the first ground conductor layer 24. Accordingly, at least some portions of the plurality of first upper cavities 60 overlap the first hollow portion H1 and the first signal conductor layer 22 in the vertical direction. The plurality of first upper cavities 60 as described above are arranged in the longitudinal direction. In the present preferred embodiment, the plurality of first upper cavities 60 are arranged at equal or substantially equal intervals in the longitudinal direction.

The plurality of insulator layers 16a to 16c, 18a, 18b, 20a, and 20b include the insulator layer 16a (first insulator layer) provided above the first hollow portion H1. The insulator layer 16a (first insulator layer) is provided on the first ground conductor layer 24. In addition, the plurality of first insulator layer cavities 64 are provided in the insulator layer 16a (first insulator layer). The plurality of first insulator layer cavities 64 have a rectangular or substantially rectangular shape with long sides extending in the left-right direction as viewed in the vertical direction. That is, the plurality of first insulator layer cavities 64 are slits extending in the left-right direction. The plurality of first insulator layer cavities 64 overlap the plurality of first upper cavities 60 in the vertical direction. In the present preferred embodiment, the first insulator layer cavities 64 have the same or substantially the same shape as the first upper cavities 60 in the vertical direction. In addition, the entire or substantially the entire outer edge of the first insulator layer cavity 64 matches the entire or substantially the entire outer edge of the first upper cavity 60 in the vertical direction. As described above, the first upper cavity 60 and the first insulator layer cavity 64 define one space. Furthermore, as illustrated in FIG. 2, the first upper cavities 60 and the first insulator layer cavities 64 are continuous with the first hollow portion H1.

The structures of the plurality of lower cavities 62 and second insulator layer cavities 66 are vertically symmetric or substantially symmetric to the structures of the plurality of first upper cavities 60 and first insulator layer cavities 64. That is, the shape and the size of the plurality of lower cavities 62 and second insulator layer cavities 66 are the same or substantially the same as the shapes and the sizes of the plurality of first upper cavities 60 and first insulator layer cavities 64. More specifically, the plurality of lower cavities 62 are provided in the second ground conductor layer 26. The plurality of lower cavities 62 have a rectangular or substantially rectangular shape with long sides extending in the left-right direction as viewed in the vertical direction. That is, the plurality of lower cavities 62 are slits extending in the left-right direction. The lower cavities 62 are provided in the middle in the left-right direction of the second ground conductor layer 26. Accordingly, at least some portions of the lower cavities 62 overlap the hollow portion H2 and the first signal conductor layer 22 in the vertical direction. The plurality of lower cavities 62 as described above are arranged in the longitudinal direction. In the present preferred embodiment, the plurality of lower cavities 62 are arranged at equal or substantially equal intervals in the longitudinal direction.

The plurality of insulator layers 16a to 16c, 18a, 18b, 20a, and 20b include the insulator layer 16c (second insulator layer) provided below the hollow portion H2. The insulator layer 16c (second insulator layer) is provided below the second ground conductor layer 26. In addition, a plurality of second insulator layer cavities 66 are provided in the insulator layer 16c (second insulator layer). The plurality of second insulator layer cavities 66 have a rectangular or substantially rectangular shape with long sides extending in the left-right direction as viewed in the vertical direction. That is, the plurality of second insulator layer cavities 66 are slits extending in the left-right direction. The plurality of second insulator layer cavities 66 overlap the plurality of lower cavities 62 in the vertical direction. In the present preferred embodiment, the shape of the second insulator layer cavity 66 is the same or substantially the same as that of the lower cavity 62 in the vertical direction. In addition, the entire or substantially the entire outer edge of the second insulator layer cavity 66 matches the entire or substantially the entire outer edge of the lower cavity 62 in the vertical direction. As described above, the lower cavity 62 and the second insulator layer cavity 66 define one space. Furthermore, as illustrated in FIG. 2, the lower cavities 62 and the second insulator layer cavities 66 are continuous with the hollow portion H2.

Structure of Electronic Device

Figure 3:
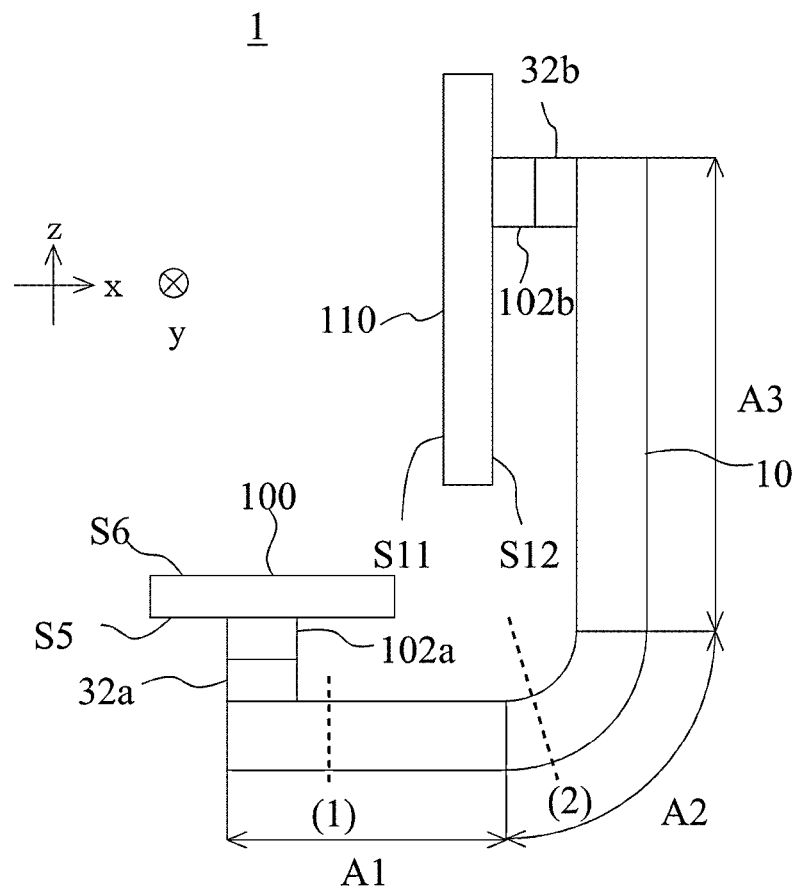
FIG. 3 is a left side view of an electronic device 1 according to a preferred embodiment of the present invention including the transmission line 10.
Figure 3:
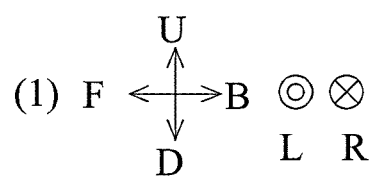
Figure 3:
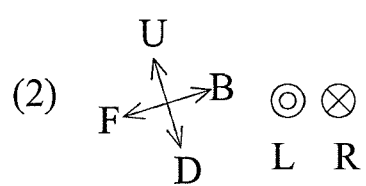
Figure 4:
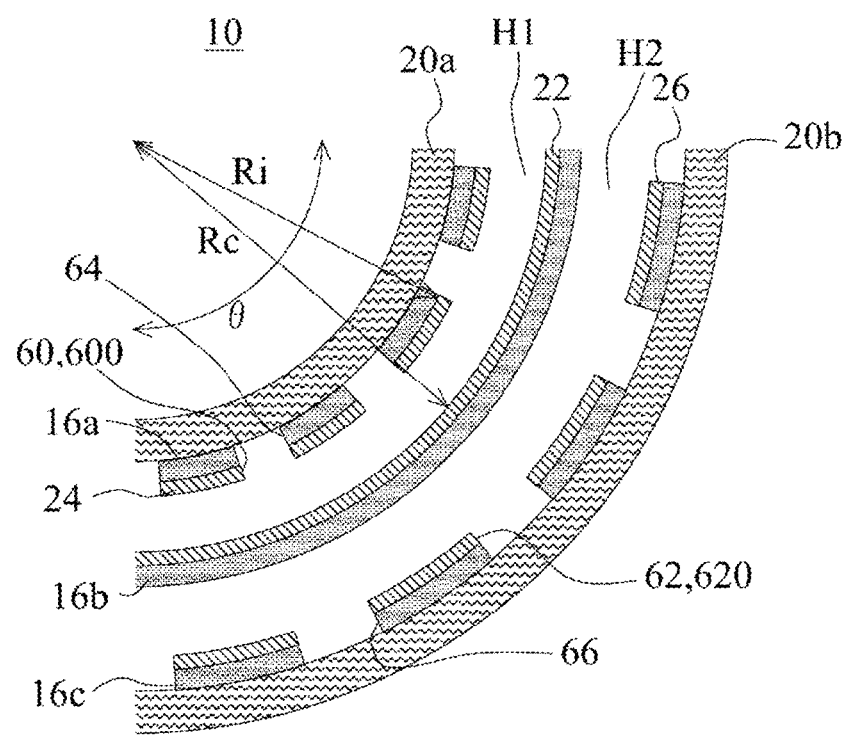
FIG. 4 is a sectional view of a bent section A2 of the transmission line 10.

Next, the structure of an electronic device 1 according to a preferred embodiment of the present invention including the transmission line 10 will be described with reference to the drawings. FIG. 3 is a left side view of the electronic device 1 having the transmission line 10. FIG. 4 is a sectional view of the bent section A2 of the transmission line 10. The electronic device 1 is, for example, a mobile wireless communication terminal. The electronic device 1 is, for example, a smartphone.

The transmission line 10 is bent as illustrated in FIG. 3. "The transmission line 10 is bent" indicates that the transmission line 10 deforms and bends when the transmission line 10 receives an external force. The transmission line 10 includes the unbent section A1, the bent section A2, and the unbent section A3. The bent section A2 is a section in which the transmission line 10 is bent. The unbent sections A1 and A3 are sections in which the transmission line 10 is not bent. Then, the X-axis, Y-axis, and Z-axis in the electronic device 1 are defined as follows. The X-axis extends in the longitudinal direction of the unbent section A1. The Y-axis extends in the left-right direction of the unbent section A1. The Z-axis extends in the vertical direction of the unbent section A1.

The bent section A2 is bent in the Z-axis direction as illustrated in FIG. 4. Accordingly, the vertical direction and the longitudinal direction differ depending on the location in the transmission line 10, as illustrated in FIG. 4. In the unbent section A1 (for example, at position (1)) in which the laminated body 12 is not bent, the vertical direction and the longitudinal direction match the Z-axis direction and the X-axis direction, respectively. On the other hand, in the bent section A2 (for example, at position (2)) in which the laminated body 12 is bent, the vertical direction and the longitudinal direction do not match the Z-axis direction and the X-axis direction, respectively.

As illustrated in FIG. 4, the electronic device 1 includes the transmission line 10, connectors 32a, 32b, 102a, and 102b, and circuit boards 100 and 110.

The circuit boards 100 and 110 have a plate shape. The circuit board 100 includes main surfaces S5 and S6. The main surface S5 is located closer than the main surface S6 to the negative side of the Z-axis. The circuit board 110 has main surfaces S11 and S12. The main surface S11 is located closer than the main surface S12 to the negative side of the X-axis. The circuit boards 100 and 110 include wiring conductor layers, ground conductor layers, electrodes, and the like, which are not illustrated.

The connector 32a is mounted on the main surface (upper main surface) on the positive side of the Z-axis in the unbent section A1. The connector 32a is mounted on the signal terminal 28a and the ground terminals 29a and 30a that are exposed through the cavities h1 to h3. The connector 32b is mounted on the main surface (upper main surface) on the negative side of the X-axis in the unbent section A3. The connector 32b is mounted on the signal terminal 28b and the ground terminals 29b and 30b that are exposed through the cavities h4 to h6.

The connectors 102a and 102b are mounted on the main surface S5 of the circuit board 100 and the main surface S12 of the circuit board 110, respectively. The connectors 102a and 102b are connected to the connectors 32a and 32b, respectively. Accordingly, the transmission line 10 electrically connects the circuit board 100 and the circuit board 110 to each other.

The bent section A2 will be described in more detail with reference to FIG. 4. The bent section A2 is bent in the Z-axis direction (vertical direction in the unbent section A1) with respect to the unbent section A1. In the present preferred embodiment, the bent section A2 is bent in the positive direction (upper direction in the unbent section A1) of the Z-axis direction with respect to the unbent section A1. The plurality of first upper cavities 60 include one or more bent section first upper cavities 600 provided in the bent section A2. In the present preferred embodiment, all the first upper cavities 60 are provided in the bent section A2. Accordingly, all the first upper cavities 60 are the bent section first upper cavities 600.

Here, a total of the lengths in the longitudinal direction of the plurality of bent section first upper cavities 600 is defined as Wtotal. The radius of the first signal conductor layer 22 in the bent section A2 is defined as Rc. The radius of the first ground conductor layer 24 in the bent section A2 is defined as Ri. The center angle of the bent section A2 is defined as θ. At this time, the expression (1) below is met.

$$W\text{total} \geq (Rc - Ri) \times \theta \qquad (1)$$

The plurality of lower cavities 62 include one or more bent section lower cavities 620 provided in the bent section A2. In the present preferred embodiment, all of the lower cavities 62 are provided in the bent section A2. Accordingly, all of the lower cavities 62 are the bent section lower cavities 620.

Advantageous Effects

In the transmission line 10, the transmission loss of the transmission line 10 can be reduced. More specifically, the first hollow portion H1 is provided in the insulator layer 18a. Air, which has a low dielectric constant and a low dielectric dissipation factor, is present in the first hollow portion H1. Accordingly, the dielectric constant and the dielectric dissipation factor around the first signal conductor layer 22 are low. As a result, since an occurrence of dielectric loss in a high-frequency signal transmitted through the first signal conductor layer 22 is reduced or prevented in the transmission line 10, the transmission loss of the transmission line 10 is reduced. The hollow portion H2 also contributes to a reduction in the transmission loss of the transmission line 10 for the same reason as the first hollow portion H1.

In the transmission line 10, the flexibility of the transmission line 10 can be obtained while deformation of the first hollow portion H1 is reduced or prevented. More specifically, in the transmission line 10, the plurality of first upper cavities 60 are provided in the first ground conductor layer 24. This makes the first ground conductor layer 24 more likely to deform, thus improving the flexibility of the transmission line 10. However, when the first upper cavity 60 is provided in the first ground conductor layer 24, deformation of the first ground conductor layer 24 that causes deformation of the first hollow portion H1 may occur.

Accordingly, the plurality of insulator layers 16a to 16c, 18a, 18b, 20a, and 20b include the insulator layer 16a (first insulator layer) provided above the first hollow portion H1. Accordingly, the first ground conductor layer 24 is supported by the insulator layer 16a. As a result, in the transmission line 10, deformation of the first ground conductor layer 24 that causes deformation of the first hollow portion H1 can be reduced or prevented without the thickness of the first ground conductor layer 24 being increased. This reduces or prevents fluctuations in the characteristic impedance of the transmission line 10 due to deformation of the first hollow portion H1, thus reducing or preventing an occurrence of reflection of a high-frequency signal in the transmission line 10. As described above, in the transmission line 10, the flexibility of the transmission line 10 can be obtained while deformation of the first hollow portion H1 is reduced or prevented.

The first ground conductor layer 24 in the transmission line 10 is easily machined. More specifically, the plurality of insulator layers 16a to 16c, 18a, 18b, 20a, and 20b include the insulator layer 16a (first insulator layer) provided above the first hollow portion H1. Accordingly, the first ground conductor layer 24 is supported by the insulator layer 16a. Therefore, the first ground conductor layer 24 can be formed by, for example, etching the copper foil pasted onto the insulator layer 16a. Accordingly, the first ground conductor layer 24 can be formed easily and accurately. Furthermore, the first ground conductor layer 24, the signal terminals 28a and 28b, and the ground terminals 29a, 29b, 30a, and 30b can be formed at the same time. Accordingly, positional deviations among the first ground conductor layer 24, the signal terminals 28a and 28b, and the ground terminals 29a, 29b, 30a, and 30b are reduced or prevented.

In the transmission line 10, the insulator layer 16a is provided on the first ground conductor layer 24. Accordingly, the first ground conductor layer 24 is covered with the insulator layer 16a. The first ground conductor layer 24 is reduced or prevented from being exposed from the transmission line 10 to the outside. As a result, an occurrence of a short circuit due to contact between the first ground conductor layer 24 and an external conductor is prevented.

In the transmission line 10, the first ground conductor layer 24 includes no cavities in the unbent sections A1 and A3. This reduces or prevents electromagnetic waves from being emitted from the first signal conductor layer 22 to the outside of the transmission line 10 in the unbent sections A1 and A3. As a result, a loss due to emission of electromagnetic waves is less likely to occur in a high-frequency signal transmitted through the first signal conductor layer 22.

In the transmission line 10, the first ground conductor layer 24 includes no cavities in the unbent sections A1 and A3. When a metal body comes close to the transmission line 10 in the unbent sections A1 and A3, capacitance is less likely to be generated between the first signal conductor layer 22 and the metal body. As a result, in the unbent sections A1 and A3, the characteristic impedance generated in the first signal conductor layer 22 is less likely to fluctuate.

In the transmission line 10, the plurality of first upper cavities 60 are provided in the bent section A2. Accordingly, the bent section A2 is more likely than the unbent sections A1 and A3 to deform. As a result, when the transmission line 10 is bent, an unintended portion is reduced or prevented from bending.

In the transmission line 10, the first upper cavity 60 is prevented from collapsing. More specifically, the first ground conductor layer 24 is provided on the first signal conductor layer 22. Accordingly, when the bent section A2 is bent in the positive direction of the Z-axis direction with respect to the unbent section A1, the first ground conductor layer 24 is located on the inner side of the first signal conductor layer 22. Accordingly, compressive stress in the longitudinal direction is applied to the first ground conductor layer 24. In this case, the length in the longitudinal direction of the first upper cavity 60 is shortened. In addition, when the first upper cavity 60 collapses, the two long sides of the first upper cavity 60 come into contact with each other. When the two long sides of the first upper cavity 60 come into contact with each other, excessive stress is applied to the first ground conductor layer 24, and the first ground conductor layer 24 may break.

Accordingly, equation (1) is met in the transmission line 10.

$$Wtotal \geq (Rc-Ri) \times \theta \tag{1}$$

Wtotal: Total of the lengths in the longitudinal direction of the plurality of bent section first upper cavities 600

Rc: Radius of the first signal conductor layer 22 in the bent section A2

Ri: Radius of the first ground conductor layer 24 in the bent section A2

$\theta$: Center angle of the bent section A2

This prevents the first upper cavity 60 from collapsing, thus preventing the two long sides of the first upper cavity 60 from coming into contact with each other. As a result, the first ground conductor layer 24 is prevented from breaking.

In the transmission line 10, the plurality of first insulator layer cavities 64 are provided in the insulator layer 16a. In addition, the plurality of first insulator layer cavities 64 overlap the plurality of first upper cavity 60 in the vertical direction. Accordingly, the plurality of first upper cavities 60 and the plurality of first insulator layer cavities 64 can be formed at the same time.

In the transmission line 10, separation between the insulator layer 16b and the insulator layer 18a is reduced or prevented. More specifically, when the right end portion of the left portion of the ground conductor layer 27 is not located within the first hollow portion H1, the right end portion of the left portion of the ground conductor layer 27 is located between the insulator layer 16b and the insulator layer 18a. In this case, a gap is provided between the insulator layer 16b and the insulator layer 18a in the vicinity of a lower end P0 of the left portion of a hollow portion formation surface that defines the first hollow portion H1. Such a gap causes separation between the insulator layer 16b and the insulator layer 18a. Accordingly, the right end portion of the left portion of the ground conductor layer 27 is located within the first hollow portion H1. Accordingly, no gap is provided between the insulator layer 16b and the insulator layer 18a in the vicinity of the lower end P0 of the left portion of the hollow portion formation surface that defines the first hollow portion H1. As a result, in the transmission line 10, separation between the insulator layer 16b and the insulator layer 18a is reduced or prevented.

In the transmission line 10, the insulator layer 20a is pasted onto the insulator layer 16a before the lamination process. Accordingly, the insulator layer 20a is pasted onto the insulator layer 16a before the first hollow portion H1 is formed. Similarly, the insulator layer 20b is pasted onto the insulator layer 16c before the lamination process. Accordingly, the insulator layer 20b is pasted onto the insulator layer 16b before the hollow portion H2 is formed. This reduces or prevents the first hollow portion H1 and the hollow portion H2 from deforming when the insulator layers 20a and 20b are laminated together.

First Modification

Figure 5:
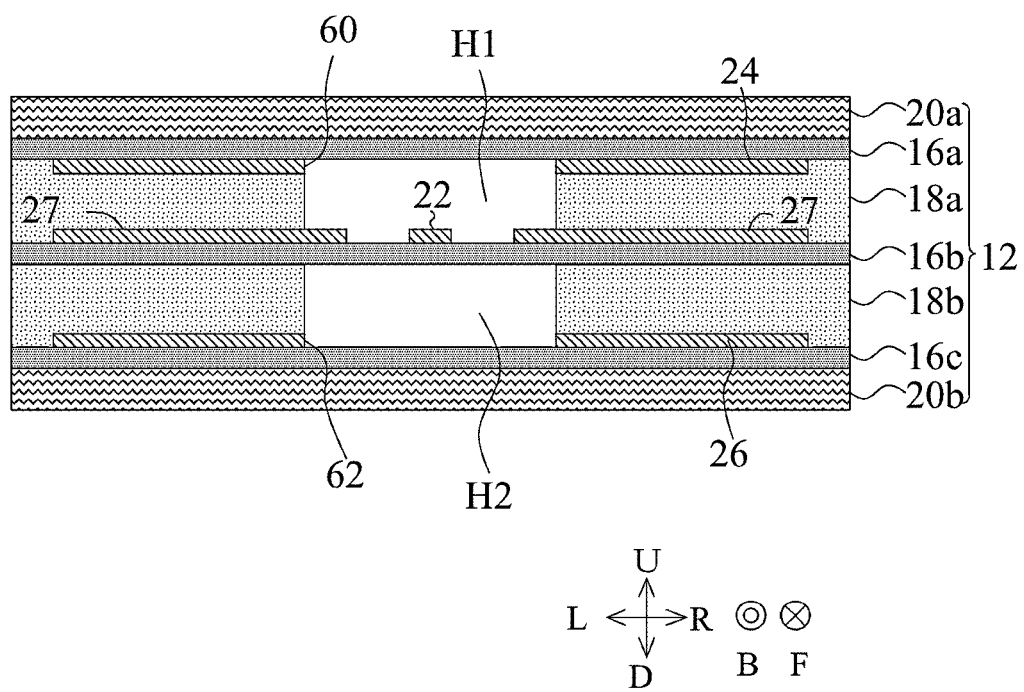
FIG. 5 is a sectional view of a transmission line 10a according to a preferred embodiment of the present invention.
Figure 6:
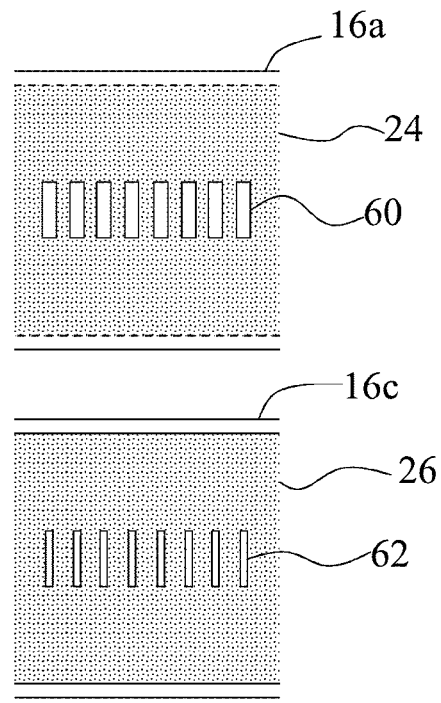
FIG. 6 is a top view of insulator layers 16a and 16c, a first ground conductor layer 24, and a second ground conductor layer 26 of a transmission line 10b according to a preferred embodiment of the present invention.
Figure 6:
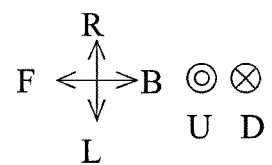

A transmission line 10a according to a first modification of a preferred embodiment of the present invention will be described below with reference to the drawings. FIG. 5 is a sectional view of the transmission line 10a.

The transmission line 10a differs from the transmission line 10 in that the first insulator layer cavities 64 and the second insulator layer cavities 66 are not provided. This reduces or prevents foreign matter from entering the first hollow portion H1 and the hollow portion H2. As a result, degradation of high-frequency characteristics of the transmission line 10 caused by foreign matter and an occurrence of a short circuit in the first signal conductor layer 22 can be reduced or prevented. The other structure of the transmission line 10a is the same or substantially the same as that of the transmission line 10, and accordingly, the description thereof is omitted. The transmission line 10a can achieve the same or substantially the same advantageous effects as the transmission line 10.

In addition, in the transmission line 10a, the first upper cavity 60 can be formed concurrently with the etching of the first ground conductor layer 24.

Second Modification

A transmission line 10b according to a second modification of a preferred embodiment of the present invention will be described below with reference to the drawings. Fig. is 6 is a top view of the insulator layers 16a and 16c, the first ground conductor layer 24, and the second ground conductor layer 26 of the transmission line 10b.

The transmission line 10b differs from the transmission line 10 in the size of the first upper cavities 60 and the size of the lower cavities 62. More specifically, the length in the longitudinal direction of the plurality of first upper cavities 60 is greater than the length in the longitudinal direction of the plurality of lower cavities 62. Accordingly, when the bent section A2 is bent in the upward direction, the first upper cavity 60 is further reduced or prevented from collapsing. The other structure of the transmission line 10b is the same or substantially the same as that of the transmission line 10, and accordingly, the description thereof is omitted.

The transmission line 10b can achieve the same or substantially the same advantageous effects as the transmission line 10.

In the transmission line 10b, when the bent section A2 is bent, the length in the longitudinal direction of the first upper cavities 60 comes close to the length in the longitudinal direction of the lower cavities 62. That is, the structure of the upper half of the transmission line 10b and the structure of the lower half of the transmission line 10b come close to each other. In addition, when the bent section A2 is bent, the length in the longitudinal direction of the lower cavities 62 increases. However, since the length in the longitudinal direction of the first upper cavities 60 is greater than the length in the longitudinal direction of the lower cavities 62, the length in the longitudinal direction of the lower cavities 62 does not become too great. As a result, the risk of emission of electromagnetic waves through the lower cavity 62 and entry of foreign matter through the lower cavity 62 are reduced or prevented.

Third Modification

Figure 7:
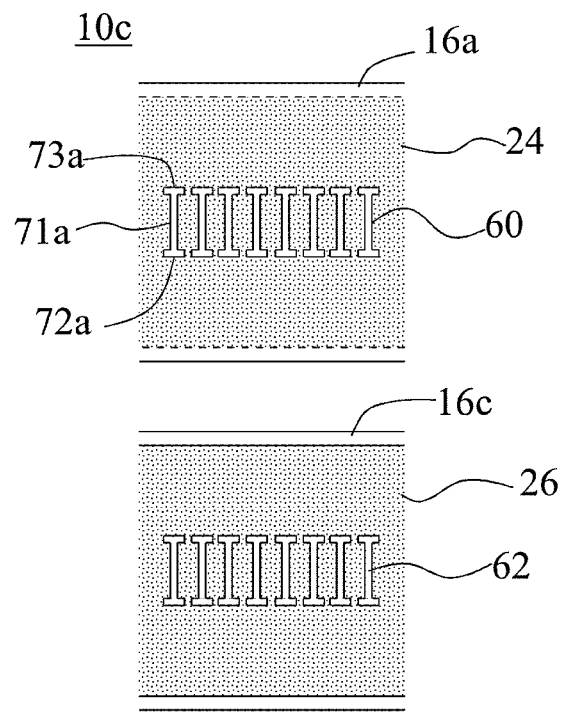
FIG. 7 is a top view of the insulator layers 16a and 16c, the first ground conductor layer 24, and the second ground conductor layer 26 of a transmission line 10c according to a preferred embodiment of the present invention.
Figure 7:
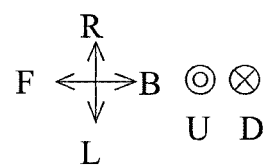

A transmission line 10c according to a third modification of a preferred embodiment of the present invention will be described below with reference to the drawings. FIG. 7 is a top view of the insulator layers 16a and 16c, the first ground conductor layer 24, and the second ground conductor layer 26 of the transmission line 10c.

The transmission line 10c differs from the transmission line 10 in the shape of the first upper cavities 60 and the shape of the lower cavities 62. More specifically, the first upper cavities 60 have an H shape in the vertical direction. The first upper cavity 60 includes a left-right direction slit portion 71a, a left-end longitudinal direction slit portion 72a, and a right-end longitudinal direction slit portion 73a. The left-right direction slit portion 71a extends in the left-right direction. The left-end longitudinal direction slit portion 72a is provided at the left end of the left-right direction slit portion 71a and extends in the longitudinal direction. The right-end longitudinal direction slit portion 73a is provided at the right end of the left-right direction slit portion 71a and extends in the longitudinal direction. Accordingly, the length in the longitudinal direction of the first upper cavities 60 at the left ends and the right ends is greater than the length in the longitudinal direction of the first upper cavities 60 in the middle in the left-right direction. The shape of the lower cavities 62 is the same or substantially the same as that of the first upper cavities 60, and accordingly, the description thereof is omitted. The other structure of the transmission line 10c is the same or substantially the same as that of the transmission line 10, and accordingly, the description thereof is omitted. The transmission line 10c can achieve the same or substantially the same advantageous effects as the transmission line 10.

In the transmission line 10c, the length in the longitudinal direction of the first upper cavities 60 at the left ends and the right ends is greater than the length in the longitudinal direction of the first upper cavities 60 in the middle in the left-right direction. When the bent section A2 is bent, the concentration of stress in the vicinity of the left ends and the right ends of the first upper cavities 60 in the first ground conductor layer 24 is reduced or prevented. This reduces or prevents the first ground conductor layer 24 from breaking.

In FIG. 7, the first upper cavity 60 may have a shape having a size that increases in the longitudinal direction toward the left end of the first upper cavity 60 from the middle in the left-right direction of the first upper cavity 60 and that increases in the longitudinal direction toward the right end of the first upper cavity 60 from the middle in the left-right direction of the first upper cavity 60.

Fourth Modification

Figure 8:
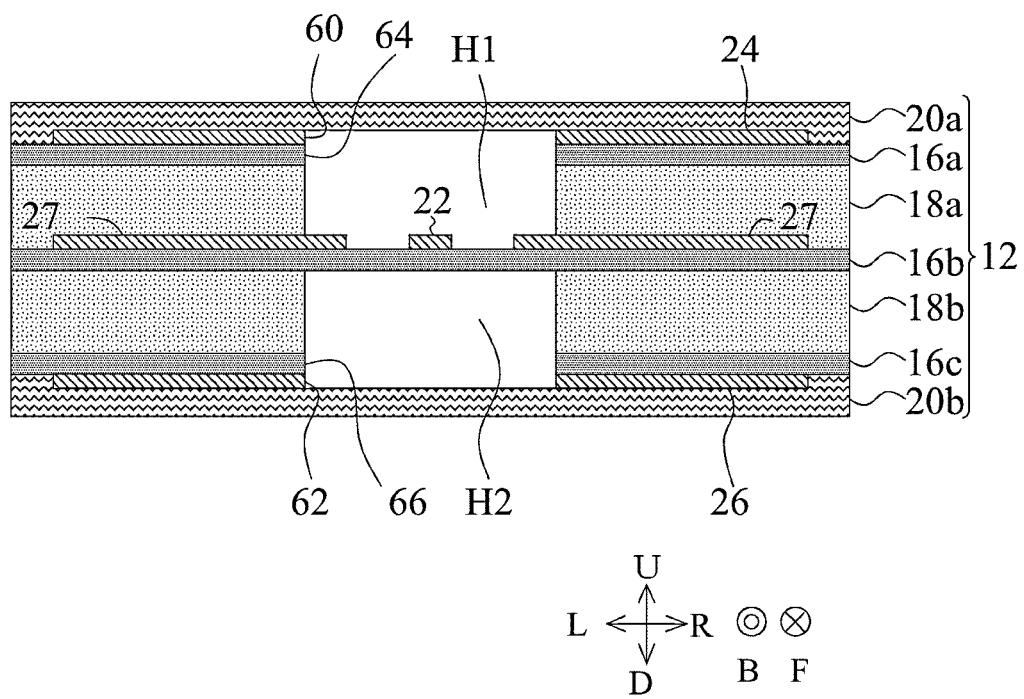
FIG. 8 is a sectional view of a transmission line 10d according to a preferred embodiment of the present invention.

A transmission line 10d according to a fourth modification of a preferred embodiment of the present invention will be described below with reference to the drawings. FIG. 8 is a sectional view of the transmission line 10d.

The transmission line 10d differs from the transmission line 10 in the position of the first ground conductor layer 24 and the position of the second ground conductor layer 26. More specifically, the first ground conductor layer 24 is provided on the upper main surface of the insulator layer 16a. The second ground conductor layer 26 is provided on the lower main surface of the insulator layer 16c. The other structure of the transmission line 10d is the same or substantially the same as that of the transmission line 10, and accordingly, the description thereof is omitted. The transmission line 10d can achieve the same or substantially the same advantageous effects as the transmission line 10. In the transmission lines 10a to 10c as well, the first ground conductor layer 24 may be provided on the upper main surface of the insulator layer 16a, and the second ground conductor layer 26 may be provided on the lower main surface of the insulator layer 16c.

Fifth Modification

Figure 9:
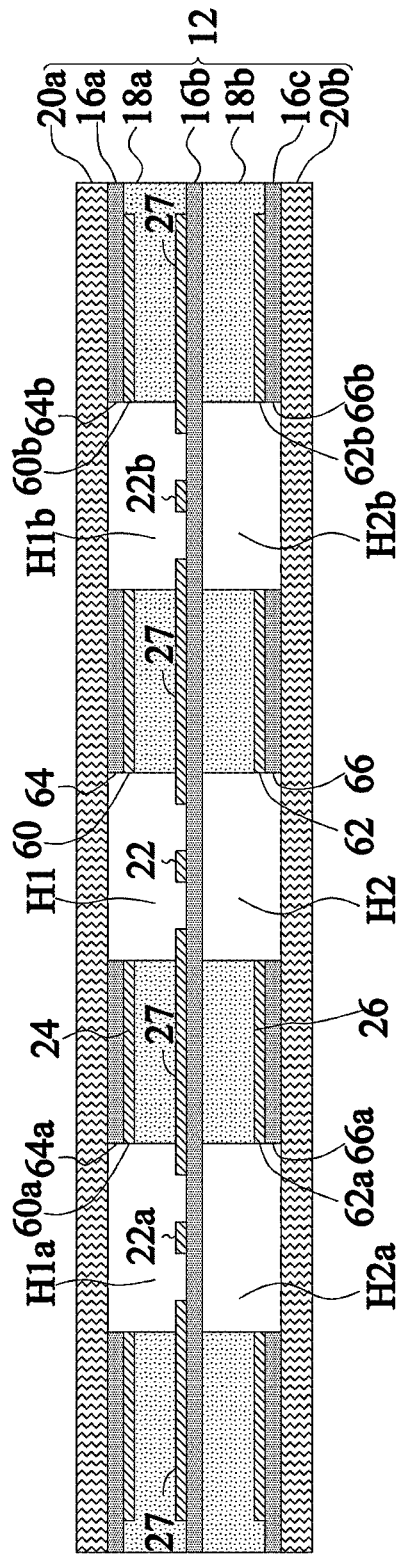
FIG. 9 is a sectional view of a transmission line 10e according to a preferred embodiment of the present invention.
Figure 10:
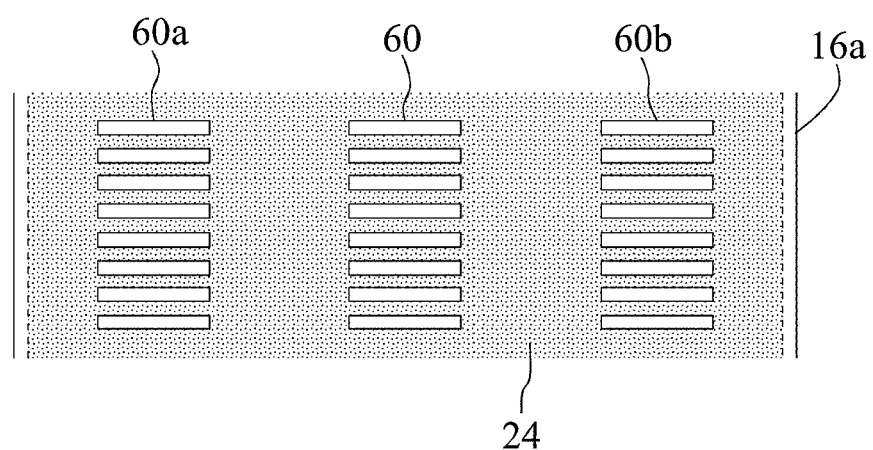
FIG. 10 is a top view of the insulator layer 16a and the first ground conductor layer 24 of a transmission line 10e according to a preferred embodiment of the present invention.
Figure 10:
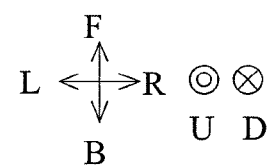

A transmission line 10e according to a fifth modification of a preferred embodiment of the present invention will be described below with reference to the drawings. FIG. 9 is a sectional view of the transmission line 10e. FIG. 10 is a top view of the insulator layer 16a and the first ground conductor layer 24 of the transmission line 10e.

The transmission line 10e differs from the transmission line 10 in that the second signal conductor layers 22a and 22b are provided and second hollow portions H1a and H1b and hollow portions H2a and H2b are provided. More specifically, the second signal conductor layers 22a and 22b are provided in the laminated body 12 and extend in the longitudinal direction. The second signal conductor layers 22a and 22b are provided on the upper main surface of the insulator layer 16b. The second signal conductor layer 22a is provided to the left of the first signal conductor layer 22. The second signal conductor layer 22b is provided to the right of the first signal conductor layer 22. The first signal conductor layer 22 and the second signal conductor layer 22a may form a differential transmission line. In addition, the first signal conductor layer 22 and the second signal conductor layer 22b may form a differential transmission line.

The second hollow portion H1a is provided in the laminated body 12 so as to be located above the second signal conductor layer 22a and below the first ground conductor layer 24. The second hollow portion H1a overlaps the second signal conductor layer 22a and the first ground conductor layer 24 in the vertical direction. The second hollow portion H1b is provided in the laminated body 12 so as to be located above the second signal conductor layer 22b and below the first ground conductor layer 24. The second hollow portion H1b overlaps the second signal conductor layer 22b and the first ground conductor layer 24 in the vertical direction.

The hollow portion H2a is provided in the laminated body 12 so as to be located below the second signal conductor layer 22a and above the second ground conductor layer 26. The second hollow portion H2a overlaps the second signal conductor layer 22a and the second ground conductor layer 26 in the vertical direction. The hollow portion H2b is provided in the laminated body 12 so as to be located below the second signal conductor layer 22b and above the second ground conductor layer 26. The second hollow portion H2b overlaps the second signal conductor layer 22b and the second ground conductor layer 26 in the vertical direction.

A plurality of second upper cavities 60a and 60b are provided in the first ground conductor layer 24. At least some portions of the plurality of second upper cavities 60a overlap the second hollow portion H1a and the second signal conductor layer 22a in the vertical direction. At least some portions of the plurality of second upper cavities 60b overlap the second hollow portion H1b and the second signal conductor layer 22b in the vertical direction. The plurality of second upper cavities 60a and 60b are arranged in the longitudinal direction.

A plurality of lower cavities 62a and 62b are provided in the second ground conductor layer 26. At least some portions of the plurality of lower cavities 62a overlap the hollow portion H2a and the second signal conductor layer 22a in the vertical direction. At least some portions of the plurality of lower cavities 62b overlap the hollow portion H2b and the second signal conductor layer 22b in the vertical direction. The plurality of lower cavities 62a and 62b are arranged in the longitudinal direction. The other structure of the transmission line 10e is the same as that of the transmission line 10, and accordingly, the description thereof is omitted. The transmission line 10e can achieve the same or substantially the same advantageous effects as the transmission line 10.

Sixth Modification

Figure 11:
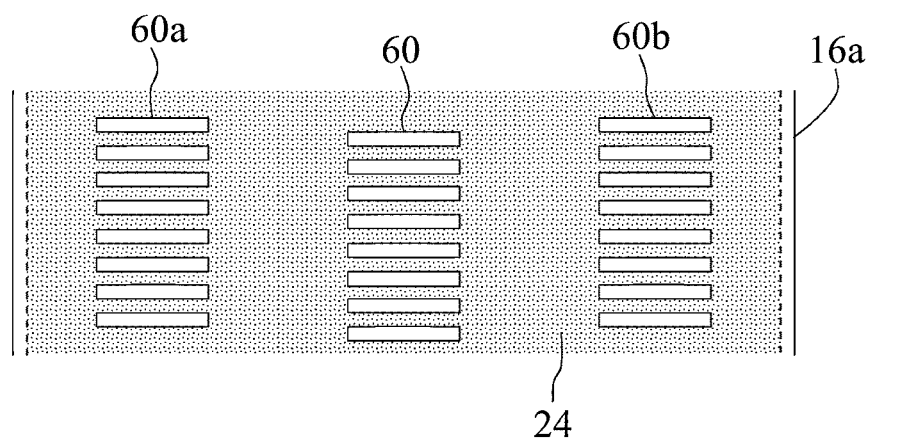
FIG. 11 is a top view of the insulator layer 16a and the first ground conductor layer 24 of a transmission line 10f according to a preferred embodiment of the present invention.
Figure 11:
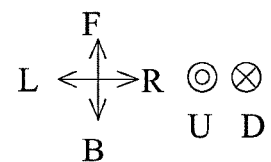

A transmission line 10f according to a sixth modification of a preferred embodiment of the present invention will be described below with reference to the drawings. FIG. 11 is a top view of the insulator layer 16a and the first ground conductor layer 24 of the transmission line 10f.

The transmission line 10f differs from the transmission line 10e in the positions of the first upper cavities 60 and the second upper cavities 60a and 60b. More specifically, the positions in the longitudinal direction of the plurality of first upper cavities 60 differ from the positions in the longitudinal direction of the plurality of second upper cavities 60a such that the plurality of first upper cavities 60 are staggered with respect to the plurality of second upper cavities 60a in the longitudinal direction. Accordingly, the second upper cavities 60a are not disposed to the left of the first upper cavities 60. The positions in the longitudinal direction of the plurality of first upper cavities 60 differ from the positions in the longitudinal direction of the plurality of second upper cavities 60b such that the plurality of first upper cavities 60 are staggered with respect to the plurality of second upper cavities 60b in the longitudinal direction. Accordingly, the second upper cavities 60b are not disposed to the right of the first upper cavities 60. This disperses the stress applied to the first ground conductor layer 24 when the bent section A2 is bent. As a result, the first ground conductor layer 24 is reduced or prevented from breaking.

The other structure of the transmission line 10f is the same or substantially the same as that of the transmission line 10e, and accordingly, the description thereof is omitted. The transmission line 10f can achieve the same or substantially the same advantageous effects as the transmission line 10e.

Seventh Modification

Figure 12:
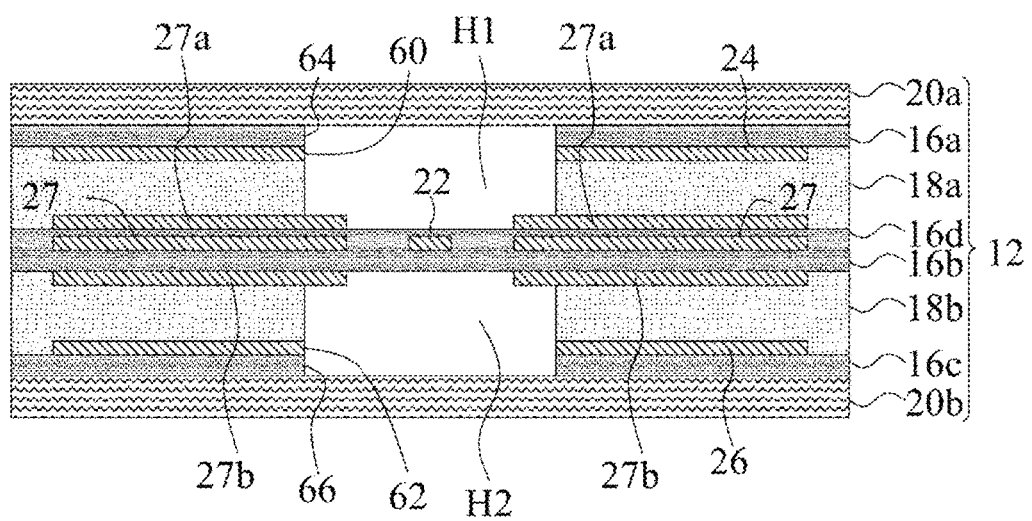
FIG. 12 is a sectional view of a transmission line 10g according to a preferred embodiment of the present invention.
Figure 12:
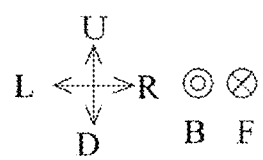

A transmission line 10g according to a seventh modification of a preferred embodiment of the present invention will be described below with reference to the drawings. FIG. 12 is a sectional view of the transmission line 10g.

The transmission line 10g differs from the transmission line 10 in that the transmission line 10g further includes an insulator layer 16d and ground conductor layers 27a and 27b. More specifically, the insulator layer 16d is laminated on the insulator layer 16b. Accordingly, the first signal conductor layer 22 is located between the insulator layer 16d and the insulator layer 16b. The first signal conductor layer 22 is no longer exposed to the first hollow portion H1. This reduces or prevents degradation of the first signal conductor layer 22 due to oxidation or the like. In addition, a short circuit between the first signal conductor layer 22 and the first ground conductor layer 24 is prevented.

In addition, the ground conductor layer 27a is provided on the upper main surface of the insulator layer 16d. The ground conductor layer 27b is provided on the lower main surface of the insulator layer 16b. The ground conductor layers 27a and 27b have the same or substantially the same shape as the ground conductor layer 27. The other structure of the transmission line 10g is the same or substantially the same as that of the transmission line 10, and accordingly, the description thereof is omitted. The transmission line 10g can achieve the same or substantially the same advantageous effects as the transmission line 10.

Eighth Modification

Figure 13:
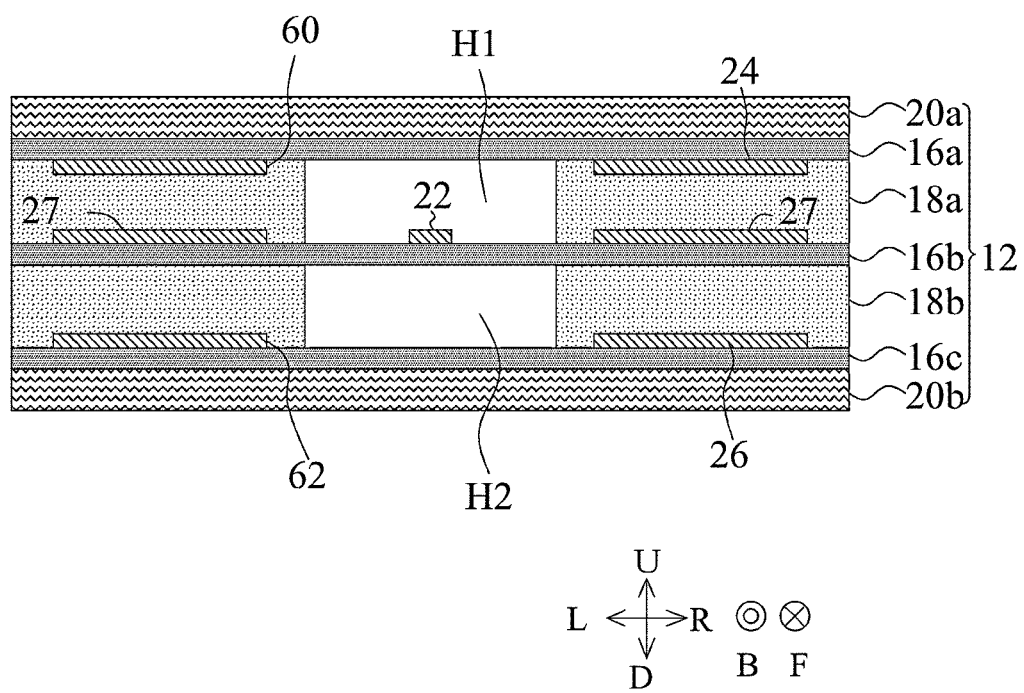
FIG. 13 is a sectional view of a transmission line 10h according to a preferred embodiment of the present invention.

A transmission line 10h according to an eighth modification will be described below with reference to the drawings. FIG. 13 is a sectional view of the transmission line 10h.

The transmission line 10h differs from the transmission line 10a in that the first ground conductor layer 24, the second ground conductor layer 26, and the ground conductor layer 27 are not exposed to the first hollow portion H1 and the hollow portion H2. This suppresses degradation of the first ground conductor layer 24, the second ground conductor layer 26, and the ground conductor layer 27 due to oxidation or the like. In addition, a short circuit between the first signal conductor layer 22 and the first ground conductor layer 24, between the first signal conductor layer 22 and the second ground conductor layer 26, and between the first signal conductor layer 22 and the ground conductor layer 27 is prevented.

Ninth Modification

Figure 14:
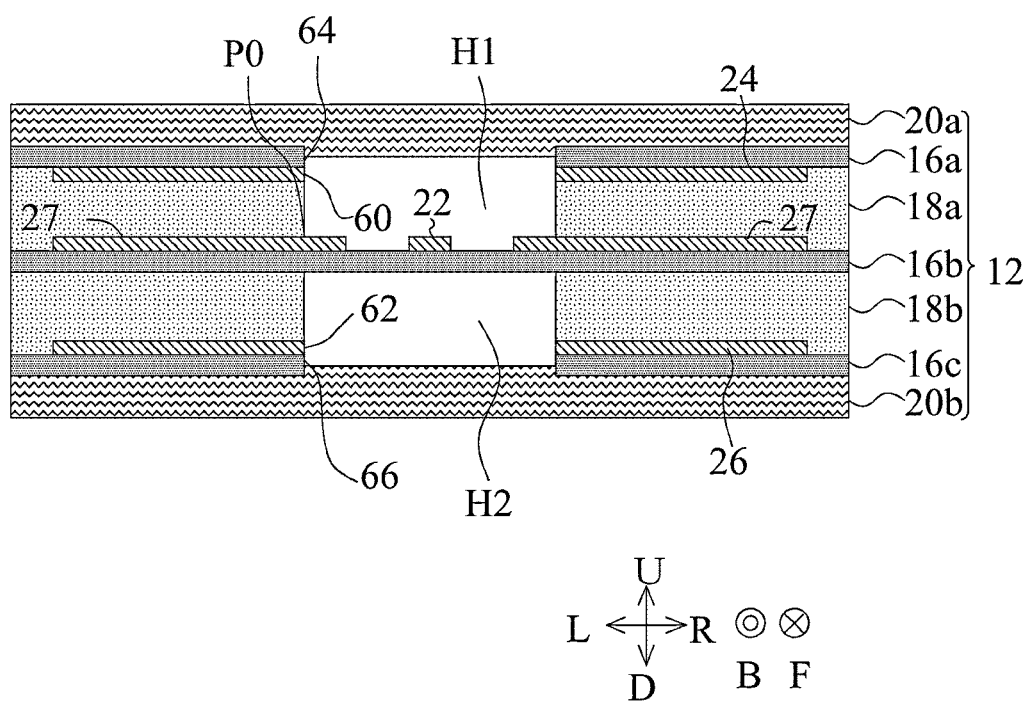
FIG. 14 is a sectional view of a transmission line 10i according to a preferred embodiment of the present invention.

A transmission line 10i according to a ninth modification of a preferred embodiment of the present invention will be described below with reference to the drawings. FIG. 14 is a sectional view of the transmission line 10i.

The transmission line 10i differs from the transmission line 10 in that a portion of the insulator layer 20a is located within the first insulator layer cavity 64 and the first upper cavity 60, and a portion of the insulator layer 20b is located within the first insulator layer cavity 64 and the lower cavity 62. The insulator layers 20a and 20b are, for example, sheets obtained by applying an adhesive to a liquid crystal polymer or a polyimide. Accordingly, the adhesives of the insulator layer 20a and 20b have entered the first upper cavity 60 and the lower cavity 62. However, the insulator layer 20a is present in a portion of the first upper cavity 60, and the insulator layer 20a is not present in the entire first upper cavity 60. The insulator layer 20b is present in part of the lower cavity 62, and the insulator layer 20b is not present in the entire lower cavity 62. The other structure of the transmission line 10i is the same or substantially the same as that of the transmission line 10, and accordingly, the description thereof is omitted. The transmission line 10i can achieve the same or substantially the same advantageous effects as the transmission line 10.

In addition, since a portion of the insulator layer 20a is located within the first insulator layer cavity 64, the insulator layer 20a is less likely to separate from the insulator layer 16a. Similarly, since a portion of the insulator layer 20a is located within the first insulator layer cavity 64, the insulator layer 20b is less likely to separate from the insulator layer 16c.

Other Preferred Embodiments

The transmission line according to the present invention is not limited to the transmission lines 10 and 10a to 10i and may be modified within the scope of the present invention. The structures of the transmission lines 10 and 10a to 10i may be combined arbitrarily.

In the transmission lines 10 and 10a to 10i, the signal terminals 28a and 28b and the ground terminals 29a, 29b, 30a, and 30b may be provided on the lower main surface of the laminated body 12.

The transmission lines 10 and 10a to 10i may further include other circuits in addition to striplines.

Electronic components other than the connectors 32a and 32b may be mounted on the transmission lines 10 and 10a to 10i.

The transmission lines 10 and 10a to 10i have a linear shape in the vertical direction. However, the transmission lines 10 and 10a to 10i may be bent. Here, "the transmission lines 10 and 10a to 10i are bent" indicates that the transmission lines 10 and 10a to 10i have a bent shape with no external force applied to the transmission lines 10 and 10a to 10i. In this case, the longitudinal direction differs depending on the position of the first signal conductor layer 22.

In the transmission lines 10 and 10a to 10i, the second ground conductor layer 26 is not a necessary component. In this case, the first signal conductor layer 22 and the first ground conductor layer 24 have a microstripline structure.

In the transmission lines 10 and 10a to 10i, the number of the first upper cavities 60 and the number of the lower cavities 62 need only be one or more.

In the transmission lines 10 and 10a to 10i, the plurality of first upper cavities 60 need only include one or more bent section first upper cavities 600 provided in the bent section A2. However, preferably, one bent section first upper cavity 600 is provided in the vicinity of the front end of the bent section A2, one bent section first upper cavity 600 is provided in the vicinity of the rear end of the bent section A2, and one or more bent section first upper cavities 600 are provided between the front end and the rear end of the bent section A2. This makes the bent section A2 more likely to be bent.

The insulator layers 20a and 20b are not necessary in the transmission lines 10 and 10a to 10i.

Each of the transmission lines 10e and 10g may include two signal transmission lines or four or more signal transmission lines.

Expression (1) need not be met in the transmission lines 10 and 10a to 10i.

The hollow portion H2 is not necessary in the transmission lines 10 and 10a to 10i.

In the transmission line 10c, the length in the longitudinal direction of the first upper cavities 60 at the left ends or the right ends need only be greater than the length in the longitudinal direction of the first upper cavities 60 in the middle in the left-right direction. Accordingly, the first upper cavity 60 need only include either the left-end longitudinal direction slit portion 72a or the right-end longitudinal direction slit portion 73a.

In the transmission line 10c, the length in the longitudinal direction of the first upper cavities 60 may increase continuously or stepwise toward the left ends or right ends from the middle in the left-right direction of the first upper cavities 60.

In the transmission lines 10 and 10a to 10i, at least some portions of the first upper cavities 60 need only overlap the first hollow portion H1 and the first signal conductor layer 22 in the vertical direction. Accordingly, the entire or substantially the entire first upper cavities 60 may overlap the first hollow portion H1 and the first signal conductor layer 22 in the vertical direction. Some portions of the first upper cavities 60 may overlap the first hollow portion H1 and the first signal conductor layer 22 in the vertical direction.

In the transmission lines 10 and 10a to 10i, the plurality of first upper cavities 60 need not be arranged at regular intervals.

In the transmission lines 10 and 10a to 10i, the plurality of first upper cavities 60 may be provided in portions other than the bent section A2. Accordingly, the plurality of first upper cavities 60 may be provided in the unbent sections A1 and A3.

In the transmission lines 10 and 10a to 10i, the plurality of interlayer connection conductors v1 and v2 may be provided in the bent section A2.

In the transmission lines 10 and 10a to 10i, the first hollow portion H1 need not be connected to one portion. Accordingly, the plurality of first hollow portions H1 may be provided in the laminated body 12. Similarly, the plurality of hollow portions H2 may be provided in the laminated body 12.

In the transmission line 10, the right end portion in the left portion of the ground conductor layer 27 need not be located within the first hollow portion H1.

In the transmission line 10, as illustrated in FIG. 2, the width in the left-right direction of the first upper cavities 60 and the width in the left-right direction of the first insulator layer cavities 64 match the width in the left-right direction of the first hollow portion H1. Accordingly, the right end portion of the left portion of the first ground conductor layer 24 does not project into the first hollow portion H1. However, the right end portion of the left portion of the first ground conductor layer 24 may project into the first hollow portion H1.

In the transmission line 10i, a portion of the insulator layer 20a may be located within the first insulator layer cavities 64 while a portion of the insulator layer 20a is not located within the first upper cavities 60. A portion of the insulator layer 20b may be located within the first insulator layer cavities 64 while a portion of the insulator layer 20b is not located within the lower cavities 62.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
    a laminated body including a plurality of insulator layers laminated together in a vertical direction;
    a first signal conductor layer in the laminated body and extending in a longitudinal direction orthogonal or substantially orthogonal to the vertical direction; and
    a first ground conductor layer in the laminated body and being provided above the first signal conductor layer to overlap the first signal conductor layer in the vertical direction; wherein
    a first hollow portion is provided in the laminated body so as to be located above the first signal conductor layer and below or adjacent to the first ground conductor layer, the first hollow portion overlaps the first signal conductor layer and the first ground conductor layer in the vertical direction, the plurality of insulator layers include a first insulator layer provided above the first hollow portion, a first upper cavity is provided in the first ground conductor layer, and at least a portion of the first upper cavity overlaps the first hollow portion and the first signal conductor layer in the vertical direction; and
    the first ground conductor layer is defined by a conductor material including metal, and the first upper cavity is provided in the conductor material including metal.

2. The transmission line according to claim 1, wherein the first insulator layer is provided on the first ground conductor layer.

3. The transmission line according to claim 2, wherein a first insulator layer cavity is provided in the first insulator layer and overlaps the first upper cavity in the vertical direction.

4. The transmission line according to claim 1, wherein
    a plurality of first upper cavities are provided in the first ground conductor layer, the first upper cavity being one of the plurality of first upper cavities; and
    the plurality of first upper cavities are arranged in the longitudinal direction.

5. The transmission line according to claim 4, wherein
    the laminated body includes a bent section and an unbent section;
    the bent section is bent with respect to the unbent section in the vertical direction; and
    the plurality of first upper cavities include one or more bent section first upper cavities in the bent section.

6. The transmission line according to claim 5, wherein
    the bent section is bent with respect to the unbent section in an upper direction of the unbent section; and
    when a total of lengths in the longitudinal direction of the one or more bent section first upper cavities is defined as Wtotal, a radius of the first signal conductor layer in the bent section is defined as Rc, a radius of the first ground conductor layer in the bent section is defined as Ri, and a center angle of the bent section is defined as θ, expression (1) is satisfied:

$$W\text{total} \geq (Rc - Ri) \times \theta \quad (1).$$

7. The transmission line according to claim 1, further comprising:
    a second ground conductor layer in the laminated body being located below the first signal conductor layer to overlap the first signal conductor layer in the vertical direction; wherein
    a second hollow portion is provided in the laminated body so as to be located below the first signal conductor layer and above the second ground conductor layer;
    the second hollow portion overlaps the first signal conductor layer and the second ground conductor layer in the vertical direction;
    the plurality of insulator layers include a second insulator layer below the second hollow portion and including a lower cavity; and
    at least a portion of the lower cavity overlaps the second hollow portion in the vertical direction.

8. The transmission line according to claim 7, wherein
    a plurality of lower cavities are provided in the second ground conductor layer, the lower cavity being one of the plurality of lower cavities;
    the plurality of lower cavities are arranged in the longitudinal direction;

the laminated body includes the bent section and the unbent section;

the bent section is bent with respect to the unbent section in the vertical direction; and the plurality of lower cavities include one or more bent section lower cavities provided in the bent section.

9. The transmission line according to claim 8, wherein a length in the longitudinal direction of the plurality of first upper cavities is greater than a length in the longitudinal direction of the plurality of lower cavities.

10. The transmission line according to claim 1, wherein a length in the longitudinal direction of the first upper cavity at at least one of a left end or a right end is greater than a length in a middle in a left-right direction of the first upper cavity.

11. The transmission line according to claim 10, wherein the first upper cavity includes a left-right direction slit portion extending in the left-right direction, a left-end longitudinal direction slit portion at a left end of the left-right direction slit portion and extending in the longitudinal direction, and a right-end longitudinal direction slit portion at a right end of the left-right direction slit portion and extending in the longitudinal direction.

12. The transmission line according to claim 1, further comprising:

a second signal conductor layer in the laminated body and extending in the longitudinal direction; wherein the second signal conductor layer is located left or right of the first signal conductor layer;

the second hollow portion is provided in the laminated body so as to be located above the second signal conductor layer and below the first ground conductor layer; and the second hollow portion overlaps the second signal conductor layer and the first ground conductor layer in the vertical direction.

13. The transmission line according to claim 12, wherein the plurality of first upper cavities and the plurality of second upper cavities are provided in the first ground conductor layer;

at least some portions of the plurality of second upper cavities overlap the second hollow portion and the second signal conductor layer in the vertical direction; and the plurality of first upper cavities and the plurality of second upper cavities are arranged in the longitudinal direction.

14. The transmission line according to claim 13, wherein a position in the longitudinal direction of the plurality of first upper cavities differs from a position in the longitudinal direction of the plurality of second upper cavities such that the plurality of first upper cavities are staggered with respect to the plurality of second upper cavities in the longitudinal direction.

15. The transmission line according to claim 1, wherein the first hollow portion is located below and adjacent to the first ground conductor layer.

16. An electronic device comprising:
the transmission line according to claim 1.

17. The electronic device according to claim 16, wherein the first insulator layer is provided on the first ground conductor layer.

18. The electronic device according to claim 17, wherein a first insulator layer cavity is provided in the first insulator layer and overlaps the first upper cavity in the vertical direction.

19. The electronic device according to claim 16, wherein
a plurality of first upper cavities are provided in the first ground conductor layer, the first upper cavity being one of the plurality of first upper cavities; and the plurality of first upper cavities are arranged in the longitudinal direction.

20. The electronic device according to claim 19, wherein the laminated body includes a bent section and an unbent section;

the bent section is bent with respect to the unbent section in the vertical direction; and the plurality of first upper cavities include one or more bent section first upper cavities in the bent section.

* * * * *